United States Patent
Dow et al.

(10) Patent No.: US 6,861,921 B1
(45) Date of Patent: Mar. 1, 2005

(54) REMOVING GROUND PLANE RESONANCE

(75) Inventors: Keith E. Dow, Folsom, CA (US); Russell N. Shryock, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/648,385

(22) Filed: Aug. 27, 2003

Related U.S. Application Data

(62) Division of application No. 09/474,662, filed on Dec. 29, 1999, now Pat. No. 6,665,927.

(51) Int. Cl.[7] .................................................. H03H 9/36
(52) U.S. Cl. ........................................ 333/12; 333/161
(58) Field of Search ............................... 333/12, 32, 33, 333/156, 700 MS, 161

(56) References Cited

U.S. PATENT DOCUMENTS 6,140,966 A * 10/2000 Pankinaho ........... 343/700 MS

FOREIGN PATENT DOCUMENTS

DE 24 44 228 A1 9/1974

* cited by examiner

*Primary Examiner*—Robert Pascal
*Assistant Examiner*—Dean Takaoka
(74) *Attorney, Agent, or Firm*—Kenyon & Kenyon

(57) ABSTRACT

A method and apparatus for decreasing resonance in a printed circuit board (PCB) uses cuts in a ground plane to slow a signal passing through the ground plane. Cuts in the ground plane may be used alone or in conjunction with the lengthening of signal traces.

3 Claims, 4 Drawing Sheets

REMOVING GROUND PLANE RESONANCE

CROSS-REFERENCE TO RELATED APPLICATIONS

This application is a divisional application of U.S. application Ser. No. 09/474,662, filed on Dec. 29, 1999, now U.S. Pat. No. 6,665,927 B1, and may benefit from the priority thereof.

FIELD OF THE INVENTION

The present invention relates to printed circuit boards (PCBs). More particularly, the present invention relates to alterations in a PCB ground plane to remove resonance.

BACKGROUND OF THE INVENTION

Printed circuit boards (PCBs) are widely used in the electronics and computer industries to mechanically and electrically couple individual components. A "motherboards" in a personal computer (PC), used to mount, and connect, a central processing unit (CPU) with other associated components is but one common example of a PCB. Generally, a PCB comprises a number of layers through which electrical signals may be routed, separated by dielectric layers. The layers for routing electrical signals may contain multiple (conducting) traces, each electrically isolated, or the entire layer may be electrically conductive. Conductive layers may be used to efficiently provide access to a particular voltage level, or voltage plane, over the entire area of the PCB. PCBs with one or more power planes, at voltages such as $V_{dd}$, and one or more ground planes are relatively common.

One design choice in routing signals within a PCB, is between routing on the top layer (microstrip routing) or routing in one of the inner layers (stripline routing). Microstrip routing typically provides faster signal speeds or "flight times" at the expense of requiring more complete connections to the routing traces. Signal speeds of 153 ps/in for microstrip routing and 170 ps/in for stripline routing are typical. An advantage of stripline routing is that such a routing makes it easier to electrically isolate the signals using isolation lines and ground planes.

The design of a trace, or conductor for a particular signal path, depends on many factors. Two important factors being the locations of the points to be connected and the required impedance of the trace. The required impedance will typically be set by the components connected by the trace, with the actual impedance a function of the inductance and capacitance of the particular trace design. Eventually, the length, width, and geometry of the trace are defined for an acceptable signal routing scheme. However, there are combinations of clock speeds and signal values that degrade the quality of signal transmissions for a given signal routing scheme. Resonances within a PCB may occur a signal on a single signal path, although isolated from other signals on the PCB, oscillates at, or near an integer multiple of signal transmit time. Such resonance may seriously degrade the performance of the PCB.

FIG. 1 depicts the stripline routing of traces 2 within a single layer of a PCB 4. The routing shown in FIG. 1 may be used within a RAMBUS RIMM module containing dynamic random access memory (DRAM) devices, RDRAMs, as licensed by Rambus, Inc. of Mountain View, Calif. The signal routing in FIG. 1 does not reflect an embodiment of the present invention. This signal routing may be susceptible to resonance under certain conditions.

Although the present invention is not intended to be limited to any particular PCB 4, or trace 2 design, an embodiment of the present invention may be used to improve signal transmission characteristics in a device such as a RDRAM. That is, under some combinations of clock speeds and signal values, resonance may decrease device performance and an embodiment of the present invention may be used to prevent, or reduce, the decrease in performance.

SUMMARY OF THE INVENTION

A method and apparatus for decreasing resonance in a printed circuit board (PCB) uses cuts in a ground plane to slow a signal passing through the ground plane. Cuts in the ground plane may be used alone or in conjunction with the lengthening of signal traces.

DETAILED DESCRIPTION

An embodiment of the present invention is directed to improving the signal transmission characteristics within a printed circuit board (PCB) by removing resonance from a ground plane.

An embodiment of the present invention will be described in the context of a RAMBUS RIMM module. The present invention is not, however, intended to be limited to any such particular application. Those of ordinary skill in the art will, with the benefit of the herein disclosure, be able to use the present invention in a wide variety of electronic devices where resonance may cause problems at certain clock speeds and/or with certain combinations of signal values.

Figure 1:
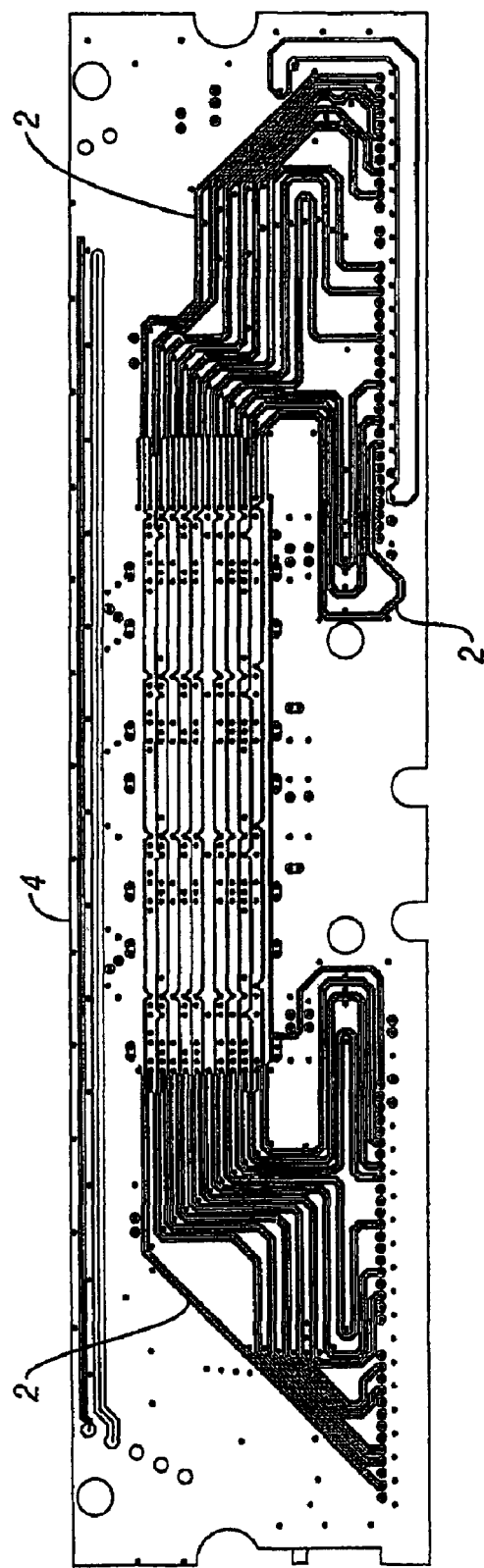
FIG. 1 shows signal trace routing within one layer of a PCB.
Figure 2:
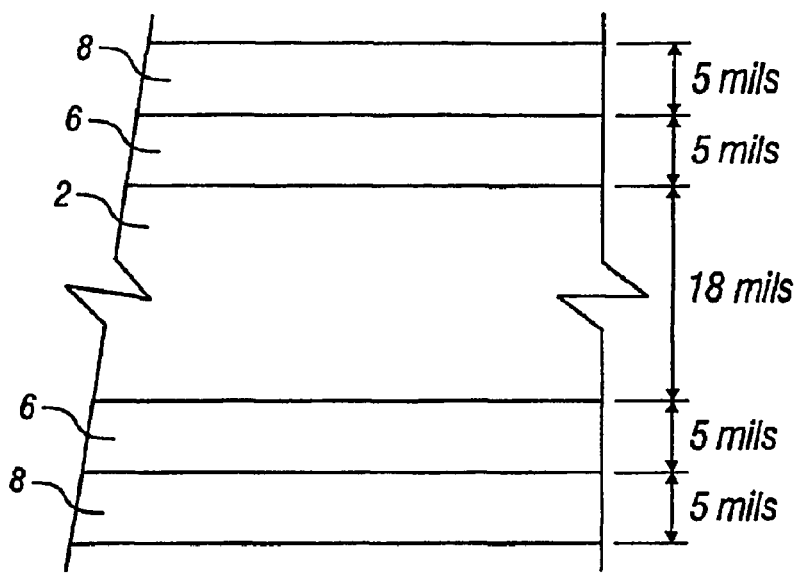
FIG. 2 shows a detailed depiction of a signal trace within one layer of a PCB together with grounded isolation lines.
Figure 3:
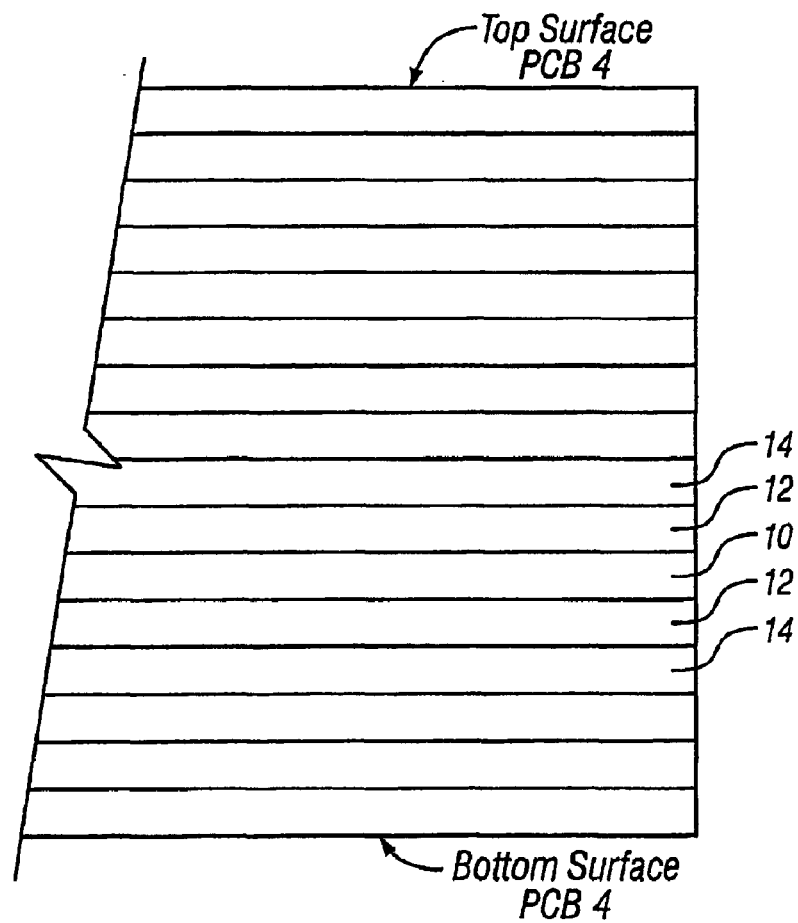
FIG. 3 is a cross section through a PCB showing the multiple layers.

In the design of traces 2 for high speed electronic devices, such as, but not limited to, PCB 4, great care is often taken to avoid interference with signals carried by traces 2. FIG. 2, shows one such design that may be used to shield a signal carried by trace 2. It is an enlarged view of trace 2 on a layer of PCB 4. Trace 2 is a 18 mil wide conductor, that is located between two 5 mil wide isolation lines 8. Isolation lines 8 are typically conductive and are preferably grounded to a single common ground. In a PCB 4, each of the signal traces 2 may be surrounded on the particular "horizontal" layer within PCB 4, by insulators 6 and isolation lines 8. In addition, signal trace 2 may be shielded vertically within PCB 4. Turning now to FIG. 3, a cross section through a PCB, a particular layer 10 with traces 2, such as shown in FIG. 1, makes up but one horizontal layer with a PCB 14. With such a design, trace 2 is surrounded both horizontally and vertically with a dielectric and a ground in order to isolate trace 2 and to minimize the effects of other signals on the one carried by trace 2. There are, however, situations where such isolation alone is not effective, resulting in poor device performance, such as single bit errors. These problems and some solutions to them will be further elaborated below.

One use of PCBs 4 is to allow standard configurations, such as a standard connect pin layout on a device, while using dissimilar component level devices to make up the device. A common example, known to those of ordinary skill in the art, would be single inline memory modules (SIMMs) such as a 72-pin SIMM specified by the Joint Electronic Device Electroneering Council (JEDEC). Although many memory components, of varying sizes, may be used by various manufacturers, the resulting device will "plug in" to a standard 72-pin SIMM socket. Thus, the standardization of a particular PCB 4 layout, such as size and connection geometry, can be valuable. This is the case even though such a standard layout may not be "optimal" for each particular embodiment in design of performance.

The RAMBUS RIMM modules, while not eclipsing SIMMs in the total number of devices sold, have gained popularity and their geometry is somewhat "fixed" by the consistent use of that geometry. Even though the present geometry of an RAMBUS RIMM module may not be optimal for all situations, changing that geometry would incur costs.

The speed or transit times of signals to and from PCB 4 depend on the signal path, or traces 2, and the individual devices through which the signal will pass. A RAMBUS RIMM module type PCB 4 with 4 RDRAMs have a signal transit time of about 1.25 ns. For a 6 RDRAM configuration the transit time is about 1.4 ns. These times are essentially fixed for a given PCB 4 layout. High speed devices, such as a RAMBUS RIMM module, often have tight timing budgets, such as a maximum skew between a clock and data signal of about 125 ps. The layout of traces 2 in FIG. I reflects such a tight timing budget The lengths of the many traces 2 are equal, within approximately 10 mils, resulting in similar transit times over the various traces 2.

Most digital electronic devices use zeros and ones, corresponding to two different voltage levels, to represent data signals. In some data combinations, such as but not limited to, 01010101 . . . , the signal oscillates between the two voltage levels. When, because of a particular clock speed and data combination, the voltage oscillation period nearly matches the transit times of signals through PCB 4, the resulting resonance may significantly decrease signal transmission performance.

Data is transferred by a RAMBUS RIMM module at 600 MHz, 712 MHz or 800 MHz, depending on the particular application. Unfortunately, these frequencies correspond to periods of 1.67 ns, 1.40 ns and 1.25 ns, respectively, which are close to some signal transit times. While not all data value combinations may lead to resonance, certain combinations might. For example, a string of zeros (or ones) may not cause a voltage switch, while the data string 00110011 . . . may well cause problems because the data transfer rate might be an integer multiple of the voltage fluctuation rate. Because a device may see almost any combination of data values, it must be designed for the worst case.

The effect of resonance on signal performance is negative; it introduces instability. An embodiment of the present invention makes relatively small adjustments in the signal paths to avoid signal transit times near the data transfer rate in order to avoid resonance problems. That is, the two periods will preferably differ enough to avoid a resonance range. For example, increasing the signal transit time for a 4 RDRAM RAMBUS RIMM module from 1.25 ns to 1.6 ns significantly decreases resonance related problems.

Figure 4A:
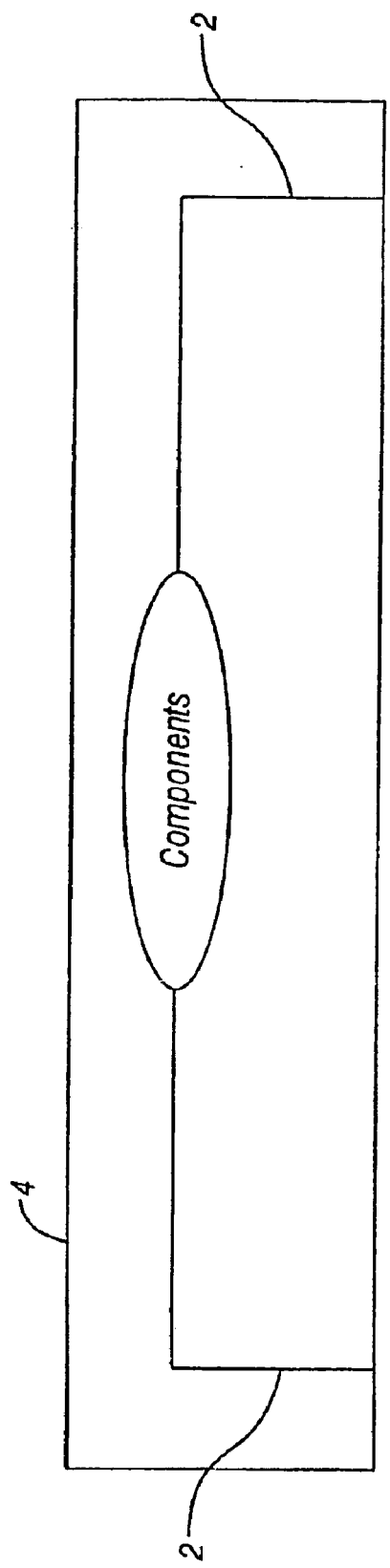
FIGS. 4A-4B depicts two layouts of a signal trace of a PCB.
Figure 4B:
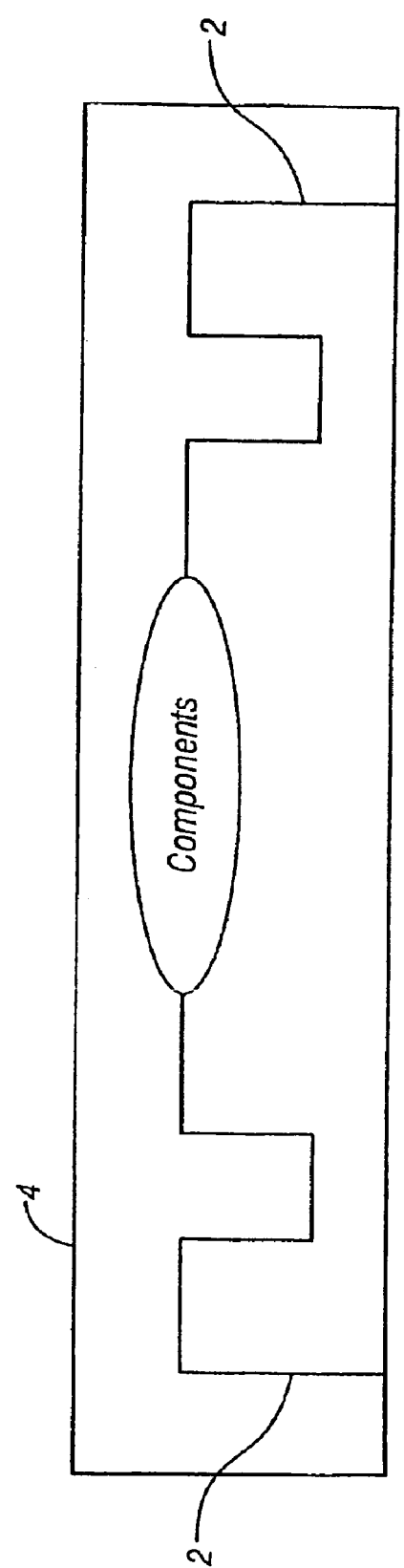

Preferably, the transit times of signals would differ from multiples of the period of the data transfer rate. One way to achieve this result, without altering the clock speed, is to change the lengths of traces 2 slightly to "detune" PCB 4. FIGS. 4A and 4B show one embodiment of lengthening traces 2. However, such lengthening of traces 2 does not directly effect resonance problems within a ground plane. In one case, detuning traces 2 still left the ground plane with a resonance caused flunctuation of approximately 100 mV. Eliminating such a fluctuation in the ground plane increases the signal-to-noise (S/N) ratio, which tends to decrease data transmission errors.

Electrical signals to and from any device typically require two conductors; typically a trace and a ground plane in PCB 4. Since a ground plane is typically a conductive layer of PCB 4, not individual traces 2, increasing the signal transit times through the ground plane requires different techniques than the lengthening used for traces 2. An embodiment of the present invention uses cuts in the conductive layer of a ground plane to reduce resonance and improve overall signal performance. Preferably, the cuts in a ground plane are coordinated with the laying out and lengthening of traces 2.

Figure 5:
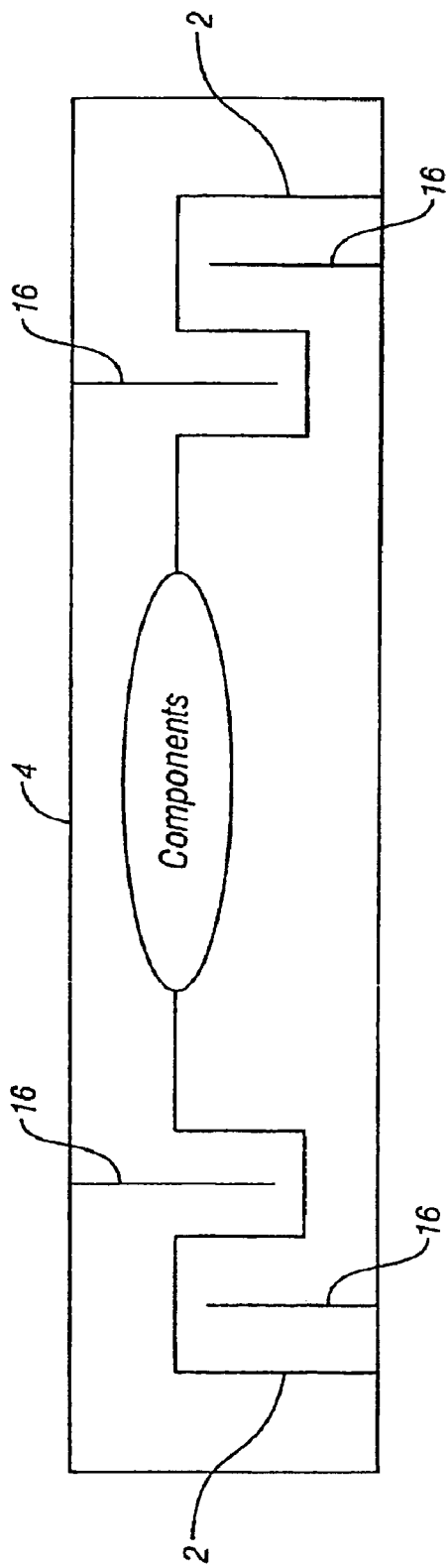
FIG. 5 depicts a cut in a PCB ground plane in accordance with an embodiment of the present invention.

FIG. 5 illustrates a PCB 4 with cuts made to a ground plane, in accordance with an embodiment of the present invention. Traces 2 have been lengthened, similar to that shown in FIG. 4B. The locations of ground plane cuts 16 are preferably coordinated with the locations of traces 2. Although only a single trace 2 layout is shown in FIG. 5, the location of all traces 2 and ground plane cuts 16 on PCB 4 are preferably coordinated such that cuts 16 terminate at least 10 miles from a trace 2. In one embodiment of the present invention, the locations of ground plane cuts 16 are similar in each ground plane layer within PCB 4. That is, cuts 16 are vertically aligned.

In one embodiment of the present invention, cut 16 is continuous. That is, there is almost no electrical current across cut 16. As is shown in FIG. 5, cuts 16 are preferably made substantially perpendicular to the long axis of PCB 4. Another embodiment uses a non-continuous "zipper cut."

Figure 6:
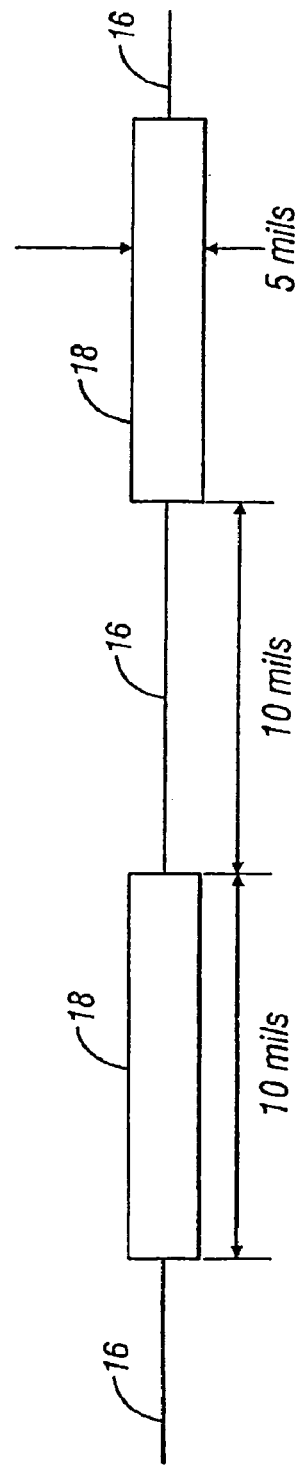
FIG. 6 illustrates the details of a zipper cut pattern in accordance with an embodiment of the present invention.

FIG. 6 illustrates such a zipper cut pattern. Along the axis of cut 16, a series of approximately 10 mil long by 5 mil wide holes are created in the ground plane at spacings of a 20 mil, center-to-center. The effect of a zipper cut pattern is a smaller decrease in signal transit times through a ground plane than a continuous cut 16 at the same location.

We claim:

1. An apparatus to decrease resonance in a printed circuit board, comprising:

a signal trace line to carry a signal;

a ground plane to connect said signal trace line to a ground;

a cut in said ground plane to increase a transit time of said signal through said ground plane; and an additional length segment within said signal trace line to increase the transit time of said signal through said signal trace line;

said additional length segment when added to said signal trace line is to increase the transit time at said signal through said signal trace line out of a resonance range.

2. An apparatus to decrease resonance in a printed circuit board, comprising:

a signal trace line to carry a signal;

a ground plane to connect said signal trace line to a ground; and a cut in said ground plane to increase the transit time of said signal through said around plane;

wherein:

said cut terminates more than 10 mils from said signal trace line.

3. An apparatus to decrease resonance in a printed circuit board, comprising:

a signal trace line to carry a signal;

a ground plane to connect said signal trace line to a ground; and a cut in said ground plane to increase the transit time of said signal through said ground plane;

wherein: a plurality of said cuts are similarly located in respective ground plane layers of said printed circuit board.

* * * * *